United States Patent
Cho et al.

(10) Patent No.: US 7,580,326 B2
(45) Date of Patent: Aug. 25, 2009

(54) OPTICAL PICKUP ACTUATOR PREVENTING SHORT CIRCUIT BY MINIMIZING UNWANTED CONTACT BETWEEN COMPONENTS

(75) Inventors: Won-Ik Cho, Seoul (KR); Hyung-Ioo Kang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 622 days.

(21) Appl. No.: 10/865,864

(22) Filed: Jun. 14, 2004

(65) Prior Publication Data
US 2005/0030842 A1    Feb. 10, 2005

(30) Foreign Application Priority Data
Aug. 4, 2003    (KR) ............ 10-2003-0053892

(51) Int. Cl.
*G11B 7/00* (2006.01)
(52) U.S. Cl. ............ 369/44.15; 369/44.16; 369/44.22; 720/686
(58) Field of Classification Search ............ 369/44.15, 369/44.22, 819, 44.16; 720/671, 675, 676, 720/681–688
See application file for complete search history.

(56) References Cited

U.S. PATENT DOCUMENTS

| | | | | |
|---|---|---|---|---|
| 5,136,558 A | * | 8/1992 | Getreuer et al. | 369/44.15 |
| 5,467,328 A | * | 11/1995 | Murakami et al. | 369/44.16 |
| 6,018,509 A | * | 1/2000 | Itoh et al. | 720/685 |
| 6,160,771 A | * | 12/2000 | Kawano et al. | 369/44.15 |
| 6,342,978 B1 | * | 1/2002 | Nishikawa et al. | 359/813 |
| 6,466,529 B1 | * | 10/2002 | Kim et al. | 369/44.32 |
| 6,643,073 B1 | * | 11/2003 | Akeda | 359/696 |
| 7,305,688 B2 | * | 12/2007 | Yang et al. | 720/683 |
| 7,336,567 B2 | * | 2/2008 | Hayashi et al. | 369/44.15 |
| 2001/0019534 A1 | * | 9/2001 | Mohri et al. | 369/247 |
| 2002/0003768 A1 | * | 1/2002 | Park et al. | 369/112.23 |
| 2002/0071357 A1 | * | 6/2002 | Takahashi et al. | 369/44.16 |
| 2002/0141323 A1 | * | 10/2002 | Horita et al. | 369/112.23 |
| 2003/0021218 A1 | * | 1/2003 | Song et al. | 369/244 |
| 2003/0058550 A1 | * | 3/2003 | Ju | 359/813 |
| 2003/0147336 A1 | * | 8/2003 | Yoshinaga | 369/244 |
| 2003/0161252 A1 | * | 8/2003 | Sugawara | 369/244 |
| 2004/0066730 A1 | * | 4/2004 | Jang et al. | 369/244 |
| 2004/0151085 A1 | * | 8/2004 | Funakoshi et al. | 369/44.16 |
| 2005/0007899 A1 | * | 1/2005 | Hayashi et al. | 369/44.15 |

OTHER PUBLICATIONS

Chinese Office Action for corresponding Chinese Patent Application No. 2004100696226 dated Sep. 5, 2008 (4 pgs).

\* cited by examiner

*Primary Examiner*—Craig A Renner
*Assistant Examiner*—Carlos E Garcia
(74) *Attorney, Agent, or Firm*—Staas & Halsey LLP

(57) ABSTRACT

An optical pickup actuator having a printed circuit board and wire fixers for fixing one end of each of a the suspension. The optical pickup actuator includes coil connectors for connection with coils connectable to an external power source. The optical pickup actuator includes a blade having stoppers that are positioned to project from the blade between the wire fixers and the coil connectors so as to stop movement of the suspension wires during installation. The optical pickup actuator has an advantage in that a short circuit problem due to contact between the suspension wire and the coils is decreased, and, therefore, the optical pickup actuator facilitates mass-production.

23 Claims, 4 Drawing Sheets

OPTICAL PICKUP ACTUATOR PREVENTING SHORT CIRCUIT BY MINIMIZING UNWANTED CONTACT BETWEEN COMPONENTS

CROSS-REFERENCE TO RELATED APPLICATIONS

This application claims the benefit of Korean Application No. 2003-53892, filed Aug. 4, 2003, in the Korean Intellectual Property Office, the disclosure of which is incorporated herein by reference.

BACKGROUND OF THE INVENTION

1. Field of the Invention

The present invention relates to an optical pickup actuator, and more particularly, to an optical pickup actuator having an improved printed circuit board structure, and a method using the same.

2. Description of the Related Art

FIG. 1 is a perspective view illustrating a conventional optical pickup actuator in which a base for attaching a magnet thereto is not shown.

Referring to FIG. 1, the conventional optical pickup actuator 10 has an objective lens 12 for converging light onto an optical recording medium, a blade 11 holding the objective lens 12, and a printed circuit board 21 positioned on the blade 11. The optical pickup actuator also includes suspension wires 13a, 13b, and 13c connected to the printed circuit board 21, a suspension wire holder 14 for supporting the suspension wires 13a, 13b, and 13c, and wire fixers 15a, 15b, and 15c positioned on the printed circuit board 21. The optical pickup actuator 10 further includes coil connectors 17a, 17b, and 17c connectable to an external power source (not shown), and stoppers 19a, 19b, and 19c for stopping a movement of the suspension wires 13a, 13b, and 13c. The suspension wires 13a, 13b, and 13c are attached, e.g., soldered to the wire fixers 15a, 15b, and 15c, respectively. The printed circuit board 21 is fitted to a boss 18 and stoppers 19a, 19b, and 19c projecting from the blade 11.

In the conventional optical pickup actuator 10, in order to electrically connect the suspension wires 13a, 13b, and 13c to coils, the printed circuit board 21, having wire fixers 15a, 15b, and 15c and to which the suspension wires 13a, 13b, and 13c are attachable, e.g., soldered, is attachable to the side of the blade 11, e.g., using an adhesive. The coil connectors 17a, 17b, and 17c are positioned on the printed circuit board 21, and the coils are connectable, e.g., soldered thereto. The soldered portions are electrically connectable to the wire fixers 15a, 15b, and 15c, respectively.

However, in the conventional optical pickup actuator 10, when a plurality, e.g., three suspension wires are used on each side of the blade 11 as shown in FIG. 1, a distance between the suspension wires, e.g., between 13a and 13b is narrow. Thus, coil connectors 17a, 17b, and 17c and the suspension wires 13a, 13b, 13c may come in contact with each other during operation of the actuator, e.g., a tracking operation or a focusing operation and cause a short circuit. In addition, an amount of solder that can be used for attaching suspension wires 13a, 13b, and 13c to wire fixers 15a, 15b, and 15c, respectively, is limited due to the narrow spaces between the adjacent suspension wires, e.g., 13a and 13b. Thus, an applied current may leak between soldered portions upon an excessive current flowing in the suspension wires. Further, the stoppers are difficult to install due to the relative placement of the wire fixers 15a, 15b, 15c and the coil connectors 17a, 17b, 17c as shown in FIG. 1. An improved optical pickup actuator having printed circuit board having an improved structure is required to improve operation and facilitate manufacturing.

SUMMARY OF THE INVENTION

To address the above-described problems, and/or other concerns, an optical pickup actuator having a printed circuit board is provided having a structure in which the printed circuit board, and other components, are improved so that a chance of a malfunction due to an unwanted contact between suspension wires and coil connecting elements is decreased.

Accordingly, an optical pickup actuator having an objective lens is provided including a blade holding the objective lens, and a printed circuit board positioned on the blade. The optical pickup actuator also includes a plurality of suspension wires connectable to the printed circuit board, and a suspension wire holder for supporting one end of each of the suspension wires. The printed circuit board has wire fixers for fixing each of the other ends of the suspension wires. The optical pickup actuator also includes coil connectors that are connectable to coils that are connectable to an external power source. The blade includes stoppers positioned so as to protrude from the blade between the wire fixers and the coil connectors for stopping a movement of the suspension wires during installation.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings in which.

DETAILED DESCRIPTION OF THE INVENTION

Figure 1:
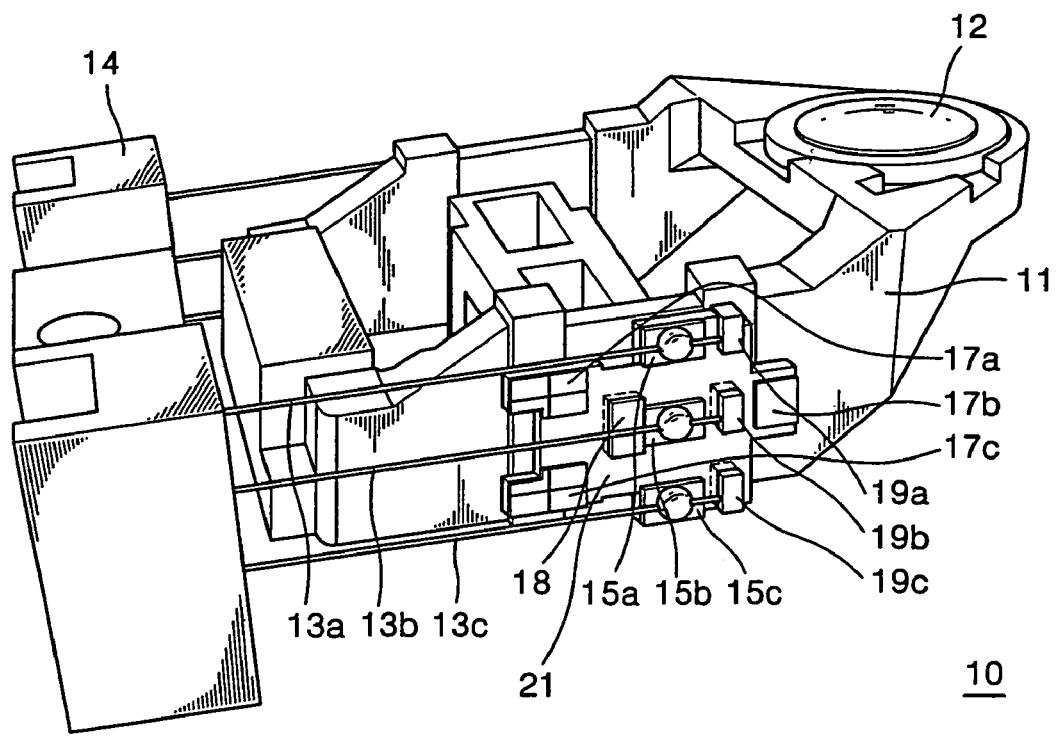
FIG. 1 is a perspective view illustrating a conventional optical pickup actuator in which a base for attaching a magnet thereto is not shown.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2A:
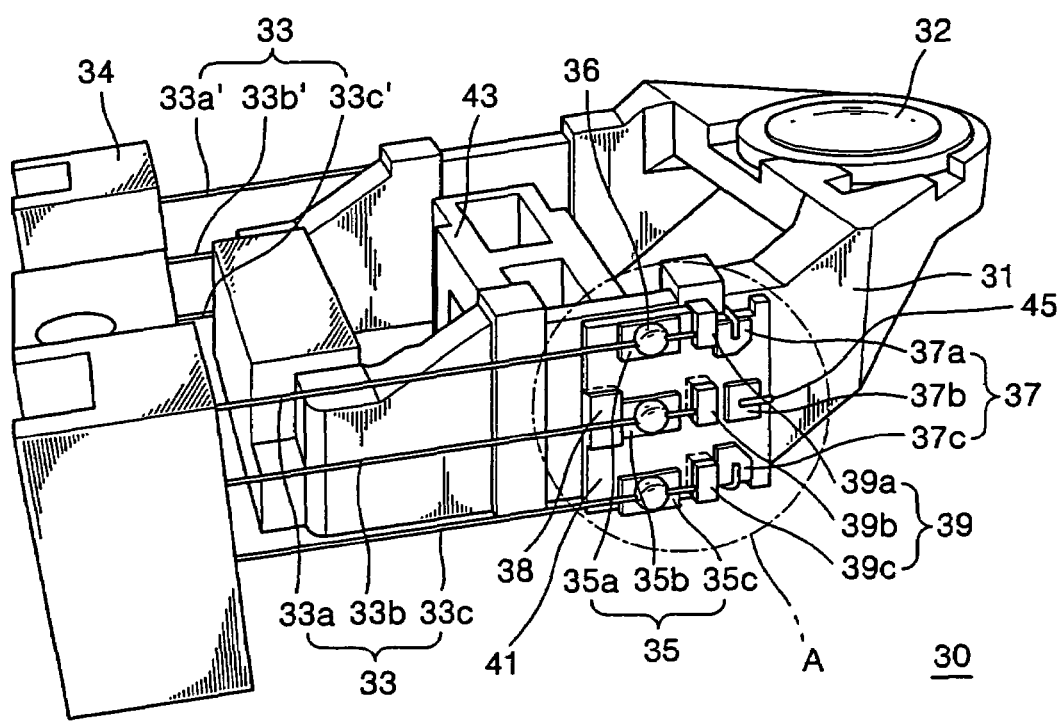
FIG. 2A is a perspective view illustrating an optical pickup actuator according to an aspect of the present invention in which a base for attaching a magnet thereto is not shown.
Figure 2B:
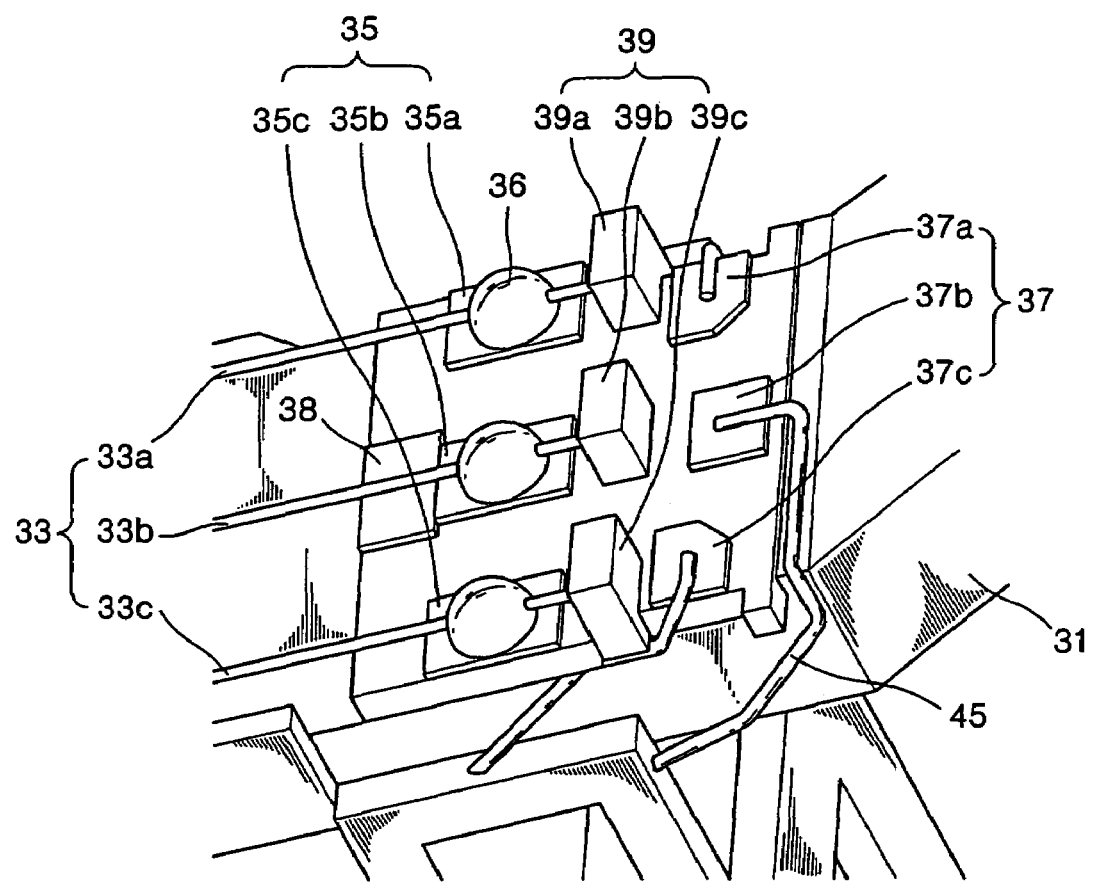
FIG. 2B is an enlarged view of a circled portion A of FIG. 2A.

FIG. 2A is a perspective view illustrating an optical pickup actuator according to an aspect of the present invention in which a base for attaching a magnet thereto is not shown, and FIG. 2B is an enlarged view of a circled portion A of FIG. 2A.

Referring to FIGS. 2A and 2B, an optical pickup actuator 30 according to an aspect of the present invention includes an objective lens 32 for converging light onto an optical recording medium (not shown), and a blade 31 holding the objective lens 32. The optical pickup actuator 30 also includes suspension wires 33 for movably supporting the blade 31, and a suspension wire holder 34 to which one end of each of the suspension wires 33 is fixedly joinable. A printed circuit board 41, to which the other end of each of the suspension wires 33 is connectable, is attachable to a side of the blade 31.

The printed circuit board 41 has wire fixers 35 to which the suspension wires 33 are attachable, e.g., by a soldering joint 36. The printed circuit board 41 also includes coil connectors 37 to which coil leads 45, connectable to an external power source (not shown), are attachable. According to an aspect of the present invention, the wire fixers 35 and the coil connectors 37 are arranged parallel with each other with stoppers 39 disposed therebetween.

A plurality of holes (not shown), e.g., four holes, are formed in the printed circuit board 41 so that a plurality of bosses, e.g., four bosses that protrude from the blade 31 are fittable into a respective hole. For example, each of the three bosses, e.g., first, second, and third stoppers 39a, 39b, and 39c, and the separate boss 38 facing the second stopper 39b are fittable into respective holes. The printed circuit board 41 is attachable to the side of the blade 31, e.g., by an adhesive applied on a back surface of the printed circuit board. According to an aspect of the present invention, the boss 38 that does not also serve as a stopper, is positioned such that in conjunction with the first, second, and third stoppers 39a, 39b, and 39c the printed circuit board 41 is precisely positioned on the blade. According to an aspect of the present invention, an assembled blade 31 and printed circuit board 41 that includes the first, second, and third stoppers 39a, 39b, and 39c and the boss 38 is sturdier than assembled blades and circuit boards without such features.

The suspension wires 33 include a plurality of wires, e.g., six in total. For example, three suspension wires 33a, 33b, and 33c are positioned on one side of the blade 31 and three suspension wires 33a', 33b', and 33c' positioned on the other side of the blade 31. The wires are arranged in parallel with each other. According to an aspect of the present invention, two pairs of suspension wires are symmetrically positioned on both sides of the blade 31 for generating electromagnetic forces in a focusing direction and a tracking direction. A third pair of the suspension wires is positioned on both sides of the blade 31 for generating electromagnetic forces in a tilting direction.

According to an aspect of the present invention, the blade 31 includes two suspension wires 33 with two wire fixers 35 and two coil connectors 37 positioned, respectively, on each side of the blade 31. The number of suspension wires 33 is determined in accordance with a number of suspension wires 33 required for a focusing, a tracking, and/or a tilting servo movement. In addition, the diameter and length of the suspension wires 33 are determined depending on required material characteristics including stiffness.

Figure 2C:
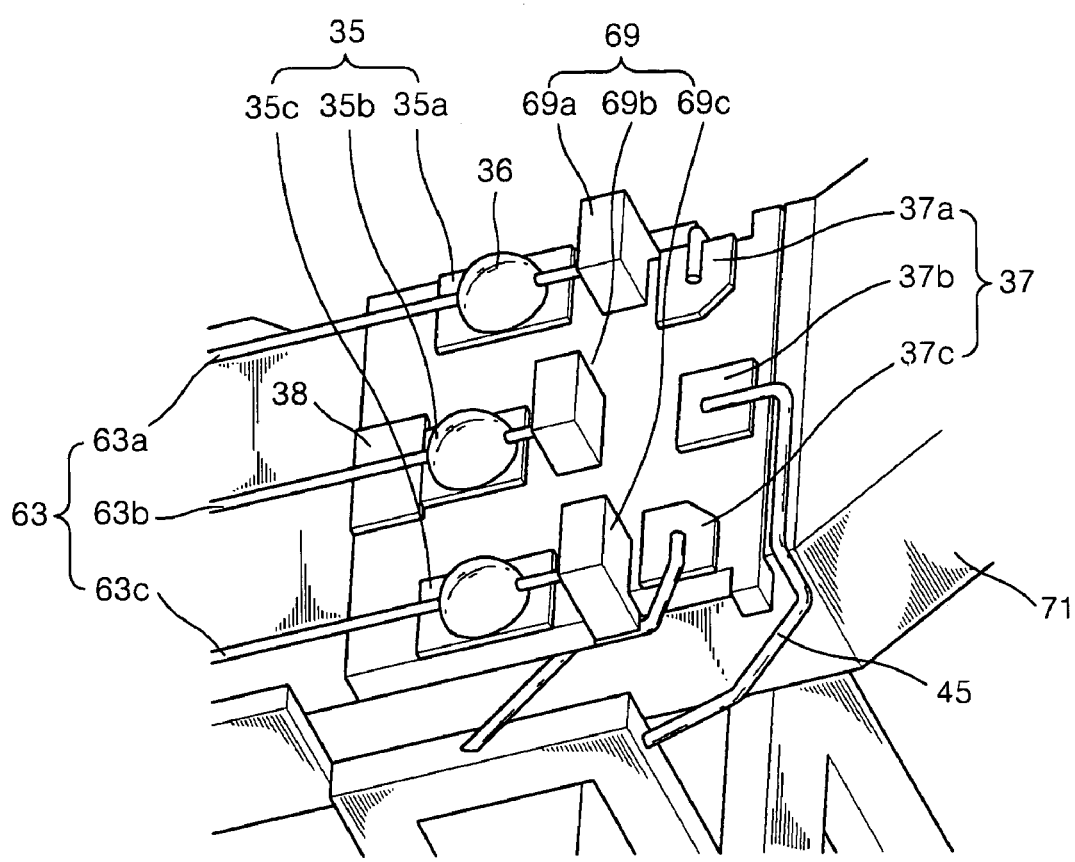
FIG. 2C is a perspective view illustrating an optical pickup actuator having suspension wires with different lengths, according to an aspect of the present invention.

According to an aspect of the present invention, the blade 21 includes three suspension wires on each side of the blade 31, e.g., first, second, and third suspension wires 33a, 33b, and 33c. According to an aspect of the present invention and as illustrated in FIG. 2C, first, second, and third suspension wires 63a, 63b and 63c have different lengths from each other. For example, when the second suspension wire 63b is shorter than the first and third suspension wires 63a and 63c, the first stopper 69a and the third stopper 69c are positioned at more forward positions than that of the second stopper 69b with respect to a leading edge of the blade 71.

One end of each of the first, second, and third suspension wires 33a, 33b, and 33c is fixable to the suspension wire holder 34, and the other ends thereof are fixedly attachable, e.g., soldered to the respective first, second, and third wire fixers 35a, 35b, and 35c. During an installation of the first, second, and third suspension wires 33a, 33b, and 33c, the feeding of the first, second, and third suspension wires 33a, 33b, and 33c in a direction toward the objective lens 32 is stopped by the respective first, second, and third stoppers 39a, 39b, and 39c. That is, the first, second, and third stoppers 39a, 39b, and 39c cause the first, second, and third suspension wires 33a, 33b, and 33c to have substantially the same length after the first, second, and third suspension wires 33a, 33b, and 33c are fed during installation.

The first, second, and third coil connectors 37a, 37b, and 37c are positioned to face respective first, second, and third wire fixers 35a, 35b, and 35c with the first, second, and third stoppers 39a, 39b, and 39c interposed therebetween. By positioning the wire fixers 35, the stoppers 39, and the coil connectors 37 in parallel with each other on the printed circuit board 41 as described above, the suspension wires 33 are easily fed during installation. In addition, an occurrence of the previously described short circuit problem due to contact between the coil leads 45 and the suspension wires 33 is decreased. In addition, since the influence of interference between the suspension wires 33 and the coils 45 is reduced, the quantity of soldered lead can be increased. Thus, a joining force between the suspension wires 33 and the blade 31 is increased. A coil lead 45 is soldered onto each of the first, second, and third coil connectors 37a, 37b, and 37c. The soldered joints are electrically connectable to the wire fixers 35.

Magnets (not shown) positioned on a base (not shown) are insertable into through-holes in the blade 31. Yokes 43, positioned on the blade 31, are wound with coils (not shown). The blade 31 is driven, e.g., in focusing, tracking, and tilting directions by Lorentz forces due to interactions between currents flowing through the coils and magnetic fields developed by the magnets.

Since, according to an aspect of the present invention, the printed circuit board has a simple structure in which the wire fixers, the stoppers, and the coil connectors are positioned substantially in a straight line, the occurrence of the short circuit problem due to contact between the coils and the wires is decreased. In addition, according to an aspect of the present invention, mass-production of the optical pickup actuator, having enhanced performance, is facilitated.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An optical pickup actuator for use with an objective lens on a base, comprising:
    a blade having a plurality of stoppers and holding the objective lens;
    a plurality of coils positioned on the base and connectable to an external power source;
    a plurality of suspension wires movingly supporting the blade on the base;
    a suspension wire holder supporting one end of each of the suspension wires; and
    a printed circuit board connectable to the suspension wires, comprising:
    a plurality of wire fixers fixing the other ends of each of the suspension wires, and
    a plurality of coil connectors each connectable to one of the coils,
    wherein the stoppers are positioned to protrude from the blade through corresponding holes in the printed circuit board between the wire fixers and the coil connectors for stopping a movement of the suspension wires.

2. The optical pickup actuator according to claim 1, wherein the blade further comprises a boss positioned to protrude from a surface thereof for joining the printed circuit to the blade.

3. The optical pickup actuator according to claim 1, wherein the plurality of suspension wires are substantially equal in length and are arranged in parallel with each other.

4. The optical pickup actuator according to claim 1, wherein the suspension wires are different in length and are parallel with each other.

5. The optical pickup actuator according to claim 1, wherein a number of wire fixers and a number of coil connectors are each the same as the number of the suspension wires.

6. The optical pickup actuator according to claim 1, wherein each of the suspension wires is attachable to a respective one of the plurality of the wire fixers by a soldering joint.

7. The optical pickup actuator according to claim 1, wherein the printed circuit board is attachable to the blade by an adhesive applied on a back surface of the printed circuit board.

8. The optical pickup actuator according to claim 1, wherein one of the stoppers also serves as a boss securing the printed circuit board.

9. The optical pickup actuator according to claim 1, wherein the fixers, the stoppers, and the coil connectors are positioned substantially in parallel with each other on the printed circuit board to facilitate a feeding of the suspension wires during installation.

10. The optical pickup actuator according to claim 1, wherein the fixers, the stoppers, and the coil connectors are positioned substantially in a straight line.

11. The optical pickup actuator according to claim 1, wherein each of the coil connectors is connected to one of the coils by a soldered coil lead to form a solder joint, and the solder joint is electrically connectable to one of the wire fixers.

12. The optical pickup actuator according to claim 2, wherein the boss also serves as a stopper.

13. The optical pickup actuator according to claim 2, wherein the boss is fittable through a hole in the printed circuit board.

14. An optical pickup actuator for use with an objective lens on a base, the optical pickup actuator comprising:
a blade holding the objective lens;
a plurality of coils positioned on the base;
a plurality of suspension wires connectable to a printed circuit board and movingly supporting the blade on the base; and
a plurality of stoppers stopping a feeding of each of a respective suspension wire,
wherein the printed circuit board includes
a plurality of wire fixers fixing an end of each of the suspension wires, and
a plurality of coil connectors each connectable to one of the coils, and
the plurality of suspension wires includes at least one suspension wire whose length is shorter than another of the suspension wires, the length of each wire being measured as a distance between a suspension wire holder and a respective stopper of the plurality of stoppers.

15. The optical pickup actuator according to claim 14, wherein a diameter and length of each of the suspension wires are determined depending on a stiffness of the suspension wires.

16. The optical pickup actuator according to claim 14, wherein the suspension wires are arranged in parallel with each other.

17. The optical pickup actuator according to claim 14, wherein a number of the plurality of suspension wires is determined in accordance with a number of suspension wires required in a focusing, a tracking, and/or a tilting movement of the blade.

18. The optical pickup actuator according to claim 17, wherein the number of suspension wires is four including two pairs of suspension wires symmetrically positioned on both sides of the blade generating electromagnetic forces in a focusing direction and a tracking direction.

19. The optical pickup actuator according to claim 17, wherein the number of suspension wires is six including a third pair of the suspension wires positioned on both sides of the blade generating electromagnetic forces in a tilting direction.

20. An optical pickup actuator for use with an objective lens on a base, the optical pickup actuator comprising:
a blade holding the objective lens and having a plurality of stoppers;
a plurality of coils positioned on the base;
a plurality of suspension wires connectable to a printed circuit board and movingly supporting the blade on the base;
a plurality of wire fixers on the printed circuit board and fixing an end of each of the suspension wires with a solder joint; and
a plurality of coil connectors each connectable to one of the coils,
wherein each suspension wire has a wire fixer, a stopper, and a coil connector positioned substantially in a straight line along a longitudinal axis of the suspension wire and each stopper is positioned in between a corresponding fixer and a corresponding coil connector substantially along the longitudinal axis of a corresponding suspension wire.

21. The optical pickup actuator according to claim 20, wherein the wire fixers are positioned to face respective coil connectors with respective stoppers interposed therebetween.

22. The optical pickup actuator according to claim 20, wherein the blade is driven in focusing, tracking, and tilting directions by Lorentz forces due to interactions between currents flowing through the coils and magnetic fields developed by magnets positioned on the base.

23. The optical pickup actuator according to claim 20, wherein the wire fixers, the stoppers, and the coil connectors are positioned substantially in a grid-like formation on the printed circuit board such that a first column of the grid-like formation includes the fixers, a second column of the grid-like formation includes the stoppers, and a third column of the grid-like formation includes the plurality of coil connectors, the second column being disposed between the first column and the third column and each row of the grid-like formation including a fixer, a stopper and a coil connector and extending substantially along a longitudinal axis of a suspension wire corresponding to the row.

* * * * *